(12) United States Patent
Lauinger et al.

(10) Patent No.: US 6,746,709 B2
(45) Date of Patent: Jun. 8, 2004

(54) METHOD FOR MANUFACTURE OF A SOLAR CELL

(75) Inventors: Thomas Lauinger, Niedernberg (DE); Ingo Schwirtlich, Miltenberg (DE); Jens Moschner, Zeven (DE)

(73) Assignee: RWE Schott Solar GmbH, Alzenau (DE)

( * ) Notice: Subject to any disclaimer, the term of this patent is extended or adjusted under 35 U.S.C. 154(b) by 0 days.

(21) Appl. No.: 10/273,182

(22) Filed: Oct. 18, 2002

(65) Prior Publication Data

US 2004/0081747 A1 Apr. 29, 2004

(30) Foreign Application Priority Data

Oct. 19, 2001 (DE) ......................................... 101 52 707

(51) Int. Cl.⁷ .................................................. B05D 5/12
(52) U.S. Cl. ............... 427/74; 427/255.27; 427/255.29; 427/255.37; 427/255.393; 427/255.394
(58) Field of Search ....................... 427/58, 74, 255.27, 427/255.37, 255.393, 255.394, 255.29

(56) References Cited

U.S. PATENT DOCUMENTS

| | | | | |
|---|---|---|---|---|
| 6,325,857 | B1 | * 12/2001 | Miyoshi | ...................... 118/724 |
| 6,407,013 | B1 | * 6/2002 | Li et al. | ...................... 438/788 |
| 6,486,077 | B2 | * 11/2002 | Sato | ............................ 438/763 |

* cited by examiner

*Primary Examiner*—Brian K. Talbot
(74) *Attorney, Agent, or Firm*—Dennison, Schultz, Dougherty & MacDonald

(57) ABSTRACT

The invention relates to a method for manufacture of a semiconductor component by the formation of a hydrogenous layer containing silicon on a substrate comprising or containing silicon such as a wafer or film. In order to achieve a good surface and volume passivation, it is proposed that during formation of the siliceous layer in the form of $SiN_xO_y$ with $0<x \leq 1.5$ and $0 \leq y \leq 2$ one or more catalytically acting dopants are selectively added into the layer which release hydrogen from the $SiN_xO_y$ layer. The concentration C of the dopants is $1 \times 10^{14}$ cm³ $\leq C \leq 10^{21}$ cm³.

34 Claims, No Drawings

METHOD FOR MANUFACTURE OF A SOLAR CELL

BACKGROUND OF THE INVENTION

The invention relates to a method for manufacture of a solar cell by the formation of a hydrogenous layer containing silicon in the form of a passivation and/or anti-reflexion layer on a substrate comprising or containing silicon such as a wafer or film.

More than 80% of all solar cells are currently made from crystalline silicon wafers manufactured either using the Czochralski method or by means of block casting. A silicon mass in the form of a round column or large block is here crystallized and then sawn into individual wafers. This high proportion will presumably increase markedly in the coming years on account of new production capacities, since many manufacturers prefer the production techniques tried and tested for many years and based on crystalline silicon wafers to the new technologies.

Thin-film solar cells are currently being discussed as future alternatives to solar cells of silicon wafers (typical thickness around 300 $\mu$m); in comparison with solar cells made of crystalline silicon wafers, they make do with considerably less semiconductor material (thickness approx 1–10 $\mu$m). These cells can be deposited using a variety of methods directly onto large glass surfaces and therefore hold out the promise of considerable potential cost reductions. Amorphous silicon thin-film solar cells with efficiencies in the 6 to 8% range are already commercially available. Higher efficiencies can be achieved with composite semiconductors such as CdTe or $CuInS_2$. Solar cells made from these materials are currently being tested in pilot production lines (A. Abken et al., Proc. 16 FPVSEC, 2000; D. Cunningham et al., Proc. 16th EPVSEC, 2000). Whether these materials will make headway in the long term is not at present clear, as some of them are toxic or are available only in small quantities. There are high hopes for material-saving crystalline Si thin-film solar cells, since silicon is environmentally compatible and has unlimited availability. These cells are however still at a very early stage (R. Brendel et al., Proc. 14th EPVSEC, p. 1354, 1991; K. Feldrapp et al., Proc. 16th EPVSEC, 2000).

A second alternative to conventional manufacture of solar cells from crystalline silicon wafers is the use of silicon films. Here silicon is directly crystallized as a film in the thickness necessary for solar cells. This avoids the considerable cutting losses entailed by the classic block casting or Czochralski methods. The Edge-defined Film-fed Growth (EFG) method is already in industrial use, and permitting the manufacture of very high-quality silicon films. The latest developments are aimed at the reduction of the film thickness to approx. 100 $\mu$m. Unlike the block casting or Czochralski methods, the film method permits a marked reduction in the manufacturing costs, since the ratio of cutting losses to wafer volume does not increase here as the wafers become thinner. For that reason, silicon films could dominate the market during the long-term transition from the present wafer technology to thin-film technology.

A central factor in all silicon solar cells is the effective life of the charge carriers generated by light in the crystal volume. This must be sufficient to permit all charge carriers to diffuse to the metal contacts if possible and hence reach the connected circuit. This applies to the currently dominant block-cast and Czochralski-type wafers, to the silicon films which will presumably find greater application in the medium term, and to the crystalline silicon thin-film solar cells which might be possible in the future.

The effective charge carrier life of crystalline silicon is limited by crystal defects (offsets or flaws), by crystal impurities (including metal atoms), and by the quality of the crystal surface (e.g. dangling bonds). A sufficient avoidance of crystal defects and impurities and the manufacture of an ideal surface even during the crystal and wafer manufacture is not possible due to technological obstacles or for economic reasons. Attempts are therefore being made in the downstream solar cell manufacturing processes to improve the originally often short charge carrier life of the silicon wafers.

This is possible by a subsequent reduction of the impurities (Gettern) (I. J. Caballero et al., Proc. 16th EPVSEC 2000), by electronic "alleviation" of crystal defects by adding atomic hydrogen into the crystal (hydrogen volume passivation) (B. L. Sopori et al., Solar En. Mat. & Solar Cells 41/42, p. 159, 1996), and by depositing surface coatings to prevent charge carrier combination on the surface (electronic surface passivation) (A. Aberle, R. Hezel, Progr. in PV 5, p. 29, 1997). Processes in this respect can be of crucial importance for good solar cell efficiencies and are therefore already in use by industry in various designs.

For hydrogen volume passivation of silicon solar cells, known methods include the hydrogen plasma, tempering in forming gas and diffusion of hydrogen from a hydrogenous silicon nitride surface layer (SiN). For electronic surface passivation the known methods include oxidation of the silicon surface (S. Wenham et al., Solar En. Mat. & Solar Cells 65, p. 377, 2001) and application of a hydrogenous silicon nitride surface layer (A. Aberle, R. Hezel, Progr. in PV 5, p. 29, 1997). Of all the known methods, the application of a hydrogenous SiN surface layer is the only one that can achieve both processes at the same time. For this reason, more and more solar cell manufacturers are using SiN layers in their production. A further advantage of SiN surface coatings is that they have in addition to their passivation properties excellent optical parameters, allowing them to be used as effective anti-reflexion coatings.

Hydrogen volume passivation with the aid of a SiN surface coating takes place in two process steps, first the hydrogenous SiN layer is applied to the surface of the silicon wafer. In so doing, a small proportion of atomic hydrogen can already penetrate into a surface-near area of the silicon wafer. This is followed by a high-temperature treatment at temperatures in excess of 700° C. At these high temperatures, a relatively large amount of atomic hydrogen in the surface layer is freed and diffuses deep into the silicon crystal (B. L. Sopori et al., Solar En. Mat. & Solar Cells 41/42, p. 159, 1996; J. Jeong et al., J. Appl. Phys. 87 (10), p. 7551, 2000). The electronic surface passivation with the aid of a SiN surface coating is achieved by two effects. Firstly, the hydrogen contained in the layer collects at the silicon surface and passivates dangling silicon bonds, such that these become electronically ineffective. Secondly, fixed insulator charges are created in the layer, which by their influence generate in the silicon an electrical field which leads to a strengthening of the electronic passivation effect (charge carriers are kept away from the surface and hence cannot be lost) (A. G. Aberle et al., Solar En. Mat. & Solar Cells 29, p. 175, 1993). The manufacturing methods of SiN surface coatings blown for solar cell applications are:

a) Parallel-plate Plasma:

In this method, process gases containing silicon and nitrogen, preferably silane and ammonia, are excited in a low pressure system by a plasma discharge and brought to a reaction. The plasma discharge is generated between two parallel plates by applying an A.C. voltage. This is typically in the kHz or MHz frequency range, with a voltage of 100 to 1000 V (R. Reif in: handbook of Plasma Processing Technology, Noyes, N.J., 1990, p. 269 ff.).

b) Remote Microwave Plasma:

Ammonia and nitrogen is excited in a low pressure plasma outside or in a separate area of the coating chamber and then passed to the substrate. On the way there, a siliceous process gas (as a rule silane) is admixed. The excited nitrogenous gas reacts with the siliceous gas, leading to a layer deposition on the substrate.

c) LPCVD

Nitrogenous and siliceous process gases are brought thermally to a reaction in a low pressure system at temperatures in excess of 700° C. In view of the high temperatures required, this method involves several drawbacks; these include the fact that temperature-sensitive substrates cannot be processed and the hydrogen content of the SiN layers is low, as at these temperatures the major part of the hydrogen effuses from the layer.

For the surface coating of solar cells for hydrogen volume passivation and electronic surface passivation with SiN, parallel-plate SiN and remote microwave SiN layers have been exclusively used to date (A. G. Aberle, Solar En. Mat. & Solar Cells 65, p. 239, 2001). Both methods have the drawbacks that the effectiveness of the SiN layers is dependent to a high degree on the layer composition and on the deposition parameters (T. Lauinger et al., J. Vac. Sci. Technol. A 16(2), p. 530, 1998). This creates the following problems:

insufficiently high solar cell efficiencies, since the layers used do not exploit the full potential for hydrogen volume passivation and electronic surface passivation;

during the process introduction, expensive optimization experiments are necessary to ascertain the possible parameter windows;

in operation, expensive process checks are necessary to permit a constant quality of the layers;

the narrow parameter windows in which good volume passivation is possible restrict the variation possibilities of layer manufacture, so that the layers cannot be simultaneously optimized in respect of their anti-reflexion and surface passivation qualities;

the economic potential cannot be exploited to the full because of the overall sensitive method and the high checking effort involved.

A method for nitridation of silicon surfaces of semiconductor elements (ULSI) is known from Appl. Phys Lett. 71(10), p. 1371, Izumi, Matsumara, "Low-temperature nitridation of silicon surface $NH_3$-decomposed species in a catalytic chemical vapor deposition system". $SiN_xO_y$ layers have a stoichiometry ratio of Si:N:O=1:0.9:0.3 with a maximum thickness of 4.8 nm. The layer is manufactured using the Cat-CVD method with tungsten wire as the catalyst. Measurements have shown that impurities in the $SiN_xO_y$ layer resulting from tungsten are negligible. Use of a corresponding nitridation for solar cells is unsuitable in view of the low layer thickness of the $SiN_xO_y$.

To form photovoltaically active layers for a solar cell, poly-Si can be deposited using the Cat-CVD method (Solar Energy Materials & Solar Cells 69 (2001) 107–114, Niira et al., "Thin film poly-Si formation for solar cells by Flux method and Cat-CVD method"). In the poly-Si layers, metal impurities occur in a concentration of $2 \times 10^{14}$ $cm^3$ to $2 \times 10^{18}$ $cm^1$.

In Solar Energy Materials & Solar Cells Vol. 65, p. 541–547, Schropp et al., "Poly-silicon films with low impurity concentration made by hot wire chemical vapour deposition", it is described how poly-Si is deposited by means of HWCVD. Impurities of tungsten in a concentration of $10^{16}$ $cm^3$ could be ascertained.

A method for catalytic deposition of a passivation layer on a semiconductor substrate is known from U.S. Pat. No. 6,225,241 B1.

SUMMARY OF THE INVENTION

The problem underlying the present invention is to develop a method for manufacture of a solar cell such that besides good optical properties both a good surface passivation and a good volume passivation of the substrate are possible. An economical manufacture should be possible with good reproducibility. In particular, a good volume passivation should be feasible with large parameter windows, to obtain at the same time the required anti-reflexion and surface passivation layers.

The problem is solved in accordance with the invention substantially in that during formation of the siliceous layer in the form of $SiN_xO_y$ with $0 \leq x \leq 1.5$ and $0 \leq y \leq 2$ one or more catalytically acting dopants with a concentration C of $1 \times 10^{14}$ $cm^{-3} \leq C \leq 10^{21}$ $cm^{-3}$ are selectively added into the layer. The dopants release hydrogen from the $SiN_xO_y$ layer and/or influence the structure of the layer such that the latter can emit more hydrogen. In particular, the $SiN_xO_y$ layer is formed with mean values over its layer thickness of $0.1 \leq x \leq 1.5$ and $0.01 < y < 2$.

The concentration C should preferably be between $10^{16}$ $cm^{-3} \leq C \leq 10^{19}$ $cm^{-3}$.

DETAILED DESCRIPTION OF THE INVENTION

In a particularly noteworthy manner, the dopant(s) is/are substances made of or containing Groups V and VI of the periodic system or the group of refractory metals. The preferred dopants are here molybdenum, tantalum, tungsten, platinum and/or rhenium.

Here elementary tungsten and/or $WO_x$ with $0 \leq x \leq 4$ can be emphasized in particular as a dopant, having B particularly favorable influence on the structure of the growing $SiN_xO_y$ layer thanks to nucleation and effecting catalytically the activation of hydrogen contained in the layer so that both a volume passivation and a surface passivation of the substrate made up of or containing silicon are performed to the required extent.

In accordance with the invention, a hydrogenous $SiN_xO_y$ layer is selected that releases hydrogen during growth and tempering. The layer is provided with one or more dopants that, as a catalyst during growth of the layer, lead to an improved structural incorporation of hydrogen, to a separation of atomic hydrogen (protons) from hydrogenous molecules or from molecular hydrogen, or during tempering of the layer to a separation of atomic hydrogen from the atomic union of the layer.

Parallel to the surface passivation or volume passivation, an anti-reflexion layer is formed during the surface coating of the substrate of the solar cell.

Diverging from the previously prevalent view, during the formation of a $SiN_xO_y$ layer of a solar cell in particular metallic dopants are selectively added that were otherwise rated as contamination and that lead in the manufacture of semiconductor components to a deterioration in quality.

Surprisingly, the result on the basis of the teachings in accordance with the invention, i.e. the selective adding in of dopants comprising in particular one or more refractory metals, is an improvement of the solar cell properties, both by volume passivation and by surface passivation with hydrogen. It has become clear here that a simple process check is possible without having to allow for deteriorations in respect of reproducibility or quality.

A further advantage resulting is wide parameter windows in which a good surface passivation and volume passivation is possible, so that variation possibilities in layer manufacture are not restricted and hence a simultaneous optimization of the layers in respect of their anti-reflexion and surface passivation qualities is possible.

The effectiveness of the doping by the dopant(s) can be influenced by the structure and thickness of the hydrogenous silicon nitride layer and/or gradients of the doping concentration of the dopant(s) over the layer thickness.

In the case of homogeneously formed $SiN_xO_y$ layers, the stoichiometry x should be between 0.1 and 1.5 for layer thicknesses in the range between 50 nm and 110 nm.

Making the homogeneous surface layer often however creates problems, as structural changes in the surface layer often result from the influence of the substrate surface, in particular at the junction between the substrate and the surface layer. For that reason, an embodiment of the invention provides that a selective change of the stoichiometry of the $SiN_xO_y$ layer takes place such that x varies between 0.1 and 1.5 and/or y varies between 0 and 2.0 over the layer thickness, preferably with x increasing with the layer thickness in the range between 0.6 and 1.3 and y in the range between 0.1 and 1.0.

If as already mentioned the doping of the dopants is selected so as to be homogeneous, a gradient formation over the layer thickness is also possible, in particular with the concentration of the dopants increasing in the range $1 \times 10^{15}$ $cm^{-3}$ to $1 \times 10^{18}$ $cm^{-3}$ as the layer thickness increases.

One advantage of the selective formation of surface layers with steep gradients and variable thickness is an improved anti-reflexion property of the silicon nitride layer.

The teachings in accordance with the invention can be realized for all types of surface layer, i.e. with or without gradients and with different thicknesses. As already mentioned, it is also possible to manufacture the doping concentration with a gradient over the layer thickness, permitting adaptation to various surface layer systems.

A possible method for doping of $SiN_xO_y$ layers with refractory metals is the method using catalytic deposition of silicon nitride by the excitation of hydrogenous silicon and nitrogen compounds such as silane, disilane, ammonia, hydrogen or hydrazine gases in low pressure systems on hot refractory metals in the form of flat sheets or wires such as tantalum, molybdenum, tungsten, rhenium, platinum and/or niobium.

The use of suitable methods for the deposition of diamond layers is known, as are processes for the deposition of amorphous silicon for solar cells and processes for the deposition of silicon nitride as chemical/mechanical passivation, i.e. protection layer for integrated semiconductor components; however care was taken during the formation of appropriate protective layers to ensure that contamination by metals was ruled out, as otherwise the quality of the semiconductor component would suffer (H. Matsumura, Jpn. J. Appl. Phys. 37, p. 3175, 1998).

In particular, the invention provides for deposition of hydrogenous and doped surface layers on large-area silicon substrates. Here the large-area silicon substrate can be deposited as a thin silicon layer on a carrier material. The carrier material can be a glass sheet, a ceramic plate, a metal sheet or a polymer film. The silicon substrate itself can leave a micro-crystalline, amorphous or multi-crystalline crystal structure.

It is furthermore possible to form the large-area silicon substrate from a mono-crystalline or multi-crystalline silicon layer or from a silicon film. In particular, a silicon film manufactured according to the EFG method (Edge-defined Film-fed Growth) can be used. Regardless of this, the large-area silicon substrate can have a p-n junction.

By setting of coating parameters such as pressure, temperature of dopant metal, gas composition, oxygen partial pressure, substrate temperature, distance between metal and substrate, and metal geometry, a required doping of the $SiN_xO_y$ layer with the dopant such as in particular a refractory metal is possible. In particular, the deposition parameters should be within the following ranges:

| | |
|---|---|
| Pressure P: | $0.1 \text{ Pa} \leq P \leq 1000 \text{ Pa}$ |
| Metal temperature T: | $1500° \text{ C.} \leq T \leq 2500° \text{ C.}$ |
| Gas composition (ratio of siliceous to nitrogenous reaction gases): | 0.001–1.0 |
| Oxygen partial pressure: | 0–20 Pa |
| Substrate temperature: | 20° C.–600° C. |
| Distance metal to substrate: | 1–100 mm |
| Geometry of metal: | Rod, wire or plate. |

To form the $SiN_xO_y$ layer with selective doping of the dopants, a continuous or a static operation can take place. The first means that the substrate is added into the coating area when the coating source, comprising hot metal and the gas supply and removal, is switched off, with the layer being formed with the substrate stationary. Alternatively, it is possible to coat in cycles, meaning that with the coating source operating substrates are placed into the coating area, coated there, and then removed again. Finally, a continuous throughput process is possible in which the substrates are placed continuously into the coating area, passed through the latter, and removed form it.

In particular, a change of the stoichiometry in the layer composition of silicon nitride can occur due to a change in the parameters gas composition, pressure, metal temperature and total gas flow, the stoichiometry varying between 0.1 and 1.5. A change of the stoichiometry in the layer composition over the layer thickness is also possible by a time change in the parameters gas composition, pressure, metal temperature and total gas flow during a static coating. A selective stoichiometry setting is also possible by a spatial change of the parameters gas composition, pressure, metal temperature, metal geometry and total gas flow along the coating distance. The composition of the process gases without flow rate (closed chamber deposition) can be achieved using the reaction speed of the deposition.

The advantages achievable thanks to the teachings in accordance with the invention are made clear by the following table. For example, during the manufacture of EFG solar cells with hydrogenous $SiN_xO_y$ surface layers, a surprising correlation was found of the solar cell efficiency (Eta) with the content of tungsten as a dopant in the $SiN_xO_y$ layer.

| Group | Si [At %] | N [At %] | O [At %] | H [At %] | Fe [At %] | W [At %] | Eta [%] |
|---|---|---|---|---|---|---|---|
| 1 | 37 | 47 | 1.1 | 15 | — | — | 13.34 |
| 2 | 37 | 51 | 1.1 | 12 | — | — | 13.45 |
| 3 | 37 | 50 | 1.8 | 11 | 0.008 | — | 13.50 |
| 4 | 37 | 48 | 1.6 | 13 | 0.007 | 0.020 | 14.04 |
| 5 | 36 | 50 | 2.1 | 12 | 0.002 | — | 13.38 |

As the table shows, all groups have comparable silicon, nitrogen and hydrogen concentrations. Significant variations can be observed in the oxygen, iron and tungsten concentrations. Both an increased oxygen (Group 5) and an increased iron concentration (Group 3) in the SiN layers lead to no improvement in the solar cell efficiency compared with reference groups with low impurity contents (Groups 1 and 2). All these groups have efficiencies between 13.34 and 13.50%. By contrast, the increased tungsten concentration shown in Group 4 correlates clearly with a 14.04% efficiency, absolutely increased by 0.6%, of the solar cells.

While the result for Group 4 is a tungsten concentration of approx. $10^{19}$ cm$^{-3}$, it should be noted that an effect occurs even at very much lower concentrations, since hydrogen can diffuse very well and hence a few foreign atoms lead to a large number of active hydrogen atoms. A lower limit of effectiveness for foreign substance doping should be in the order of magnitude of $10^{14}$ $^{cm-3}$.

The causes for the better efficiencies of solar cells with W-doped SiN$_x$O$_y$ layer may lie in three mechanisms. Firstly, the tungsten atoms can act as a catalyst during manufacture of the layers and hence have a positive effect on the growth reactions in progress (for example it is conceivable that in the presence of tungsten a higher concentration of atomic hydrogen occurs due to the splitting of molecular hydrogen, N—H bonds or Si—H bonds. This can in particular lead to an improved electronic surface passivation).

Secondly, the tungsten atoms can lead during the downstream high-temperature treatment, again acting as a catalyst, to an increased concentration of atomic hydrogen due to the splitting of molecular hydrogen, N—H bonds or Si—H bonds, and thereby assist in particular the hydrogen volume passivation.

Thirdly, tungsten atoms can during layer growth lead to a nucleation of crystalline silicon nitride and hence to a positive structural change of the entire layer.

As a result of the tungsten doping in the hydrogenous surface coating, hydrogen is additionally activated for volume passivation and surface passivation. Instead of tungsten, all refractory metals in particular with similar chemical properties can also be used, such as Mo, Ta, Pt or Re. Furthermore, all foreign atoms or foreign molecules which like tungsten lead to an additional activation of hydrogen are suitable. Carbon can be mentioned in particular as an example. Foreign atoms in the meaning of the invention and effecting surface and volume passivation do not however include oxygen and hydrogen.

To manufacture solar cells, the doped hydrogenous surface layers must be deposited over a wide area onto the silicon substrates which differ depending on the solar cell type. To do so, the parallel-plate technology available on an industrial scale can be employed, if suitable gas additives are used that lead to deposition of the required foreign atoms in the applied layers. Since these coating methods have already been developed for widely differing substrate types, the deposition of the doped layers onto all these substrate types is possible, and hence also onto solar cells made from thin silicon layers using these carrier materials. The possible carrier materials are glass sheets, ceramic plates, metal sheets or polymer films. With substrate-independent coating methods such as remote microwave plasma or LPCVD technology, doped hydrogenous layers can in principle be deposited onto all types of substrate.

The teachings in accordance with the invention are hence suitable for all types of large-area semiconductor components, in particular however of silicon solar cells with micro-crystalline, amorphous or multi-crystalline crystal Structure in the form of films (e.g. EFG), wafers or thin layers on a carrier material. In particular, they are suitable for the passivation of large-area p-n junctions.

The invention is explained in greater detail in the following on the basis of embodiments

EXAMPLE 1

The starting material is a 100×100 mm boron-doped silicon wafer of 300 μm thickness with a conductivity of approx. 5 Ωcm and one-sided phosphorus diffusion with an emitter layer resistance of approx. 40 Ω/sq.

This wafer is moved into a vacuum chamber and heated at a pressure of less than 5×10$^{-3}$ mbar to 300° C. The wafer lies in the vacuum chamber on a horizontal special steel plate equipped with heater spirals. About 100 mm above the wafer is a quartz glass pipe passing vertically through the wall of the vacuum chamber and with a diameter of 20 mm.

After heating up of the wafer, ammonia is introduced into the chamber via the quartz glass pipe. Around 20 mm to the side of the quartz pipe is a further gas inlet through which silane is introduced into the chamber via a distributor nozzle. The mixing ratio of the gases is 1:2 (silane:ammonia). The pressure in the chamber is controlled using a setting valve in the gas outlet to 3×10$^{-2}$ mbar.

The quartz glass pipe is surrounded outside the vacuum chamber by a microwave resonator, in which 120 W of microwave power (frequency 2,54 GHz) is connected, as a result of which an ammonia plasma forms inside the glass pipe. Directly at the outlet of the quartz glass pipe is a platinum spiral which is heated to approx. 1900° C. and flowed over by the ammonia excited in the quartz glass pipe.

The excited ammonia reacts with the silane to form silicon nitride, which is deposited into the silicon wafer. Platinum atoms evaporate from the heated platinum coil and are incorporated into the silicon layer, thus leading to doping of the layer in accordance with the invention. The coating process is performed until a thickness of the silicon nitride layer of 75 nm is achieved.

Further processing of the wafers coated in this way to form solar cells leads to efficiencies greater than 14.5%.

EXAMPLE 2

The starting material is a 100×100 mm boron-doped silicon wafer of 300 μm thickness with a conductivity of approx. 5 Ωcm and one-sided phosphorus diffusion with an emitter layer resistance of approx. 40 Ω/sq.

This wafer is moved into a vacuum chamber and heated at a pressure of less than 5×10$^{-3}$ mbar to 300° C. The wafer lies in the vacuum chamber on a horizontal and circular special steel plate equipped with heater spirals and having a diameter of 300 mm. About 20 mm above the wafer is circular special steel plate with a diameter of 300 mm containing evenly distributed gas outlet openings with a diameter of 0.5 mm.

After heating up of the silicon wafer, ammonia, silane and methane are introduced via the upper special steel plate. The mixing ratio of the gases is 1:2:0.001 (silane:ammonia:methane). The pressure in the chamber is controlled using a setting valve in the gas outlet to $5\times10^{-2}$ mbar.

An A.C. voltage of 700 V (frequency 100 kHz) is applied between the upper and lower special steel plates, so that plasma is formed between the two plates.

The excited ammonia reacts with the silane to form silicon nitride, which is deposited into the silicon wafer. The methane molecules react with the plasma radicals such that carbon is incorporated into the silicon layer, thus leading to doping of the layer in accordance with the invention. The coating process is performed until a thickness of the silicon nitride layer of 75 nm is achieved.

Further processing of the wafers coated in this way to form solar cells leads to efficiencies greater than 14.6%.

What is claimed is:

1. A method for manufacture of a solar cell comprising a hydrogenous layer containing silicon in the form of a passivation and/or anti-reflection layer on a substrate comprising silicon,
comprising forming the hydrogenous layer containing silicon with a formula $SiN_xO_y$ with $0<x\leq1.5$ and $0\leq y\leq2$, and selectively adding into the layer at least one catalytically acting dopant with a concentration C of $1\times10^{14}$ cm$^{-3}$ $\leq C\leq 10^{21}$ cm$^{-3}$.

2. Method according to claim 1, wherein the $SiN_xO_y$ layer is formed with mean values over its layer thickness of $0.1<x<1.5$ and $0.01<y<2$.

3. Method according to claim 1, wherein the at least one dopant has a concentration C of $1\times10^{16}$ cm$^{-3}$ $\leq C\leq 1\times10^{19}$ cm$^{-3}$.

4. Method according to claim 1, wherein the at least one dopant is added in with a gradient over the thickness of the $SiN_xO_y$ layer, with the concentration C of the at least one dopant in particular increasing with increasing layer thickness in the range between $1\times10^{14}$ cm$^{-3}$ and $1\times10^{19}$ cm$^{-3}$.

5. Method according to claim 1, wherein the at least one dopant is added in a homogeneous distribution into the $SiN_xO_y$ layer.

6. Method according to claim 1, wherein the at least one dopant comprises atoms selected from the group consisting of refractory metals.

7. Method according to claim 1, wherein the at least one dopant comprises molybdenum, tantalum, tungsten, platinum, rhenium or carbon or compounds thereof.

8. Method according to claim 1, additionally comprising depositing the substrate on a glass sheet, a ceramic plate, a metal sheet or a polymer film.

9. Method according to claim 1, wherein the substrate comprising silicon has a micro-crystalline, amorphous or multi-crystalline crystal structure.

10. Method according to claim 1, wherein the substrate comprises a mono-crystalline or multi-crystalline silicon wafer or a silicon film.

11. Method according to claim 10, wherein the silicon film comprises a film manufactured by edge defined film fed growth.

12. Method according to claim 1, wherein the at least one dopant comprises elementary tungsten and/or $WO_x$ with $0\leq x\leq3$.

13. Method according to claim 1, wherein the dopant used is one which for formation of the $SiN_xO_y$ layer catalytically decomposes gases used such as silane, disilane, hydrogen, ammonia or hydrazine.

14. Method according to claim 1, wherein the hydrogenous $SiN_xO_y$ layer comprises amorphous hydrogenized silicon nitride.

15. Method according to claim 1, wherein the $SiN_xO_y$ layer is homogeneously formed.

16. Method according to claim 1, wherein the $SiN_xO_y$ layer varies over its thickness, with x increasing with the layer thickness in the range between 0.6 and 1.3 and y in the range between 0.1 and 1.0.

17. Method according to claim 1, wherein the $SiN_xO_y$ layer is formed such that its thickness is in the range between 30 nm and 150.

18. Method according to claim 1, wherein the hydrogenous $SiN_xO_y$ layer is formed by the excitation of gaseous and hydrogenous silicon and nitrogen compounds on hot refractory metals.

19. Method according to claim 1, wherein the $SiN_xO_y$ layer is formed in a reaction room in which a pressure P of $0.1 \text{ Pa}\leq P\leq 1000 \text{ Pa}$ prevails.

20. Method according to claim 19, wherein the pressure P in the reaction room is set to $1 \text{ Pa}\leq P\leq 200 \text{ Pa}$.

21. Method according to claim 1, wherein hydrogenous $SiN_xO_y$ layer has a thickness determined by at least one coating selected from the group consisting of pressure, metal temperature, gas composition, oxygen partial pressure, substrate temperature, distance between dopant and substrate, and dopant geometry.

22. Method according to claim 1, wherein the the at least one dopant is a metal set to a temperature between 1500° C. and 2500° C.

23. Method according to claim 21, wherein there is a ratio between siliceous and nitrogenous reaction gas of 0.001 to 1.0.

24. Method according to claim 21, wherein oxygen partial pressure is set to a value p with $0<p\leq 20$ Pa.

25. Method according to claim 21, wherein the substrate is set to a temperature between 20° C. and 600° C.

26. Method according to claim 21, wherein the distance between the dopant and the substrate is set to between 1 mm and 100 mm.

27. Method according to claim 21, wherein the dopant used is a metal having the geometry of a rod, wire and/or a plate.

28. Method according to claim 1, wherein the hydrogenous $SiN_xO_y$ layer is formed in a static coating operation.

29. Method according to claim 1, wherein the hydrogenous $SiN_xO_y$ layer is formed in a cyclic coating operation on the substrate.

30. Method according to claim 1, wherein the $SiN_xO_y$ layer is formed on the substrate in a continuous throughput coating operation.

31. Method according to claim 21, wherein the composition of the process gases without flow rate is set using the reaction speed of the deposition.

32. Method according to claim 1, wherein the stoichiometry composition of the $SiN_xO_y$ layer is set by changing the parameters gas composition, pressure, dopant temperature and/or total gas flow.

33. Method according to claim 28, wherein the stoichiometry change in the layer composition of the $SiN_xO_y$ layer over its thickness is set by a time change in the parameters gas composition, pressure, dopant temperature and/or total gas flow during the static coating operation.

34. Method according to claim 16, wherein the stoichiometry change in the layer composition of the $SiN_xO_y$ layer over the layer thickness is set by a spatial change of the parameters gas composition, pressure, dopant temperature, dopant geometry and/or total gas flow along the coating distance.

* * * * *